United States Patent [19]

Raynovic

[11] 4,091,312
[45] May 23, 1978

[54] CATHODE RAY DISPLAY INTENSITY MODULATOR

[75] Inventor: Samuel G. Raynovic, Phoenix, Ariz.

[73] Assignee: Honeywell Information Systems Inc., Phoenix, Ariz.

[21] Appl. No.: 729,433

[22] Filed: Oct. 4, 1976

[51] Int. Cl.² ............................................. H01J 29/52
[52] U.S. Cl. ...................................... 315/383; 315/30
[58] Field of Search ............... 315/379, 381, 383, 386, 315/30; 328/189; 358/96

[56] References Cited

U.S. PATENT DOCUMENTS

| | | | |
|---|---|---|---|
| 2,709,769 | 5/1955 | Neumann | 315/386 |
| 3,532,927 | 10/1970 | Hindel | 315/30 |

Primary Examiner—Maynard R. Wilbur
Assistant Examiner—T. M. Blum
Attorney, Agent, or Firm—William W. Holloway, Jr.; Ronald T. Reiling; Nicholas Prasinos

[57] ABSTRACT

Today's cathode ray tube oscilloscopes are widely used throughout the world and form an important basic tool in many industries. An apparatus to modulate the cathode ray display intensity, thereby enhancing the oscilloscope's capabilities in that it can now make more accurate measurements and, in effect, increase its band width, is disclosed. The apparatus to facilitate this effect is light weight, low cost, and easily connected to almost all oscilloscopes now in use.

3 Claims, 2 Drawing Figures

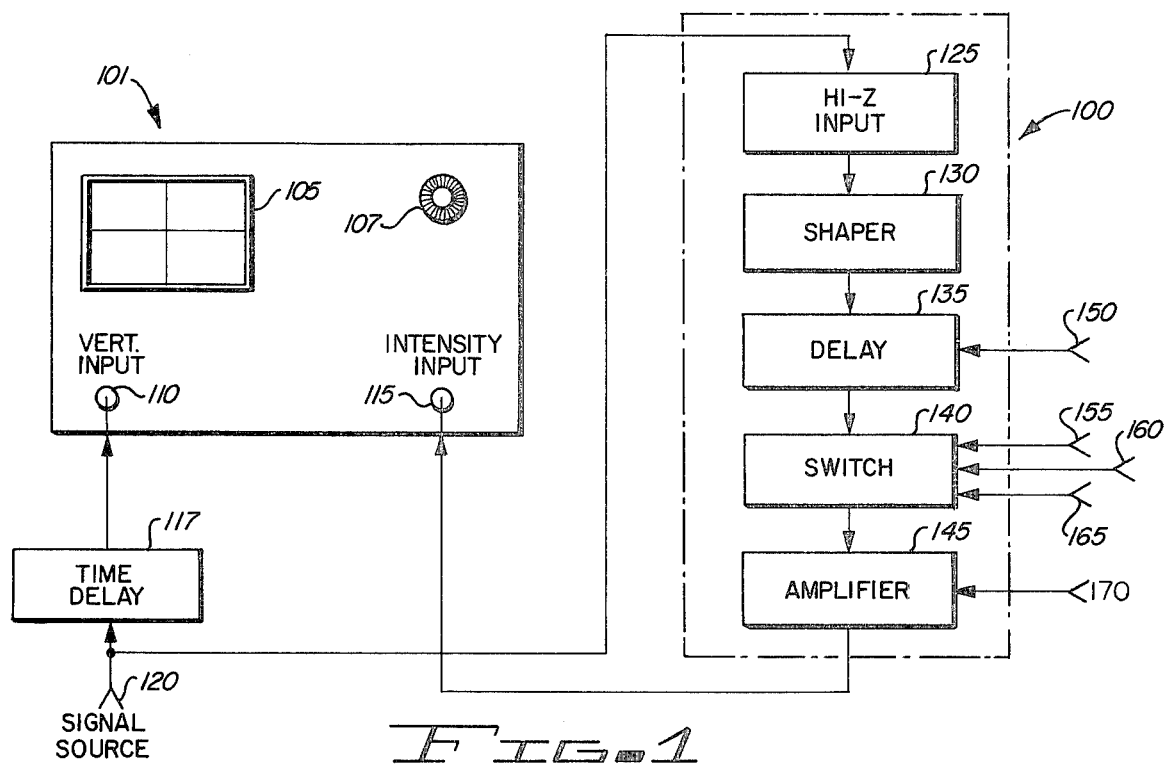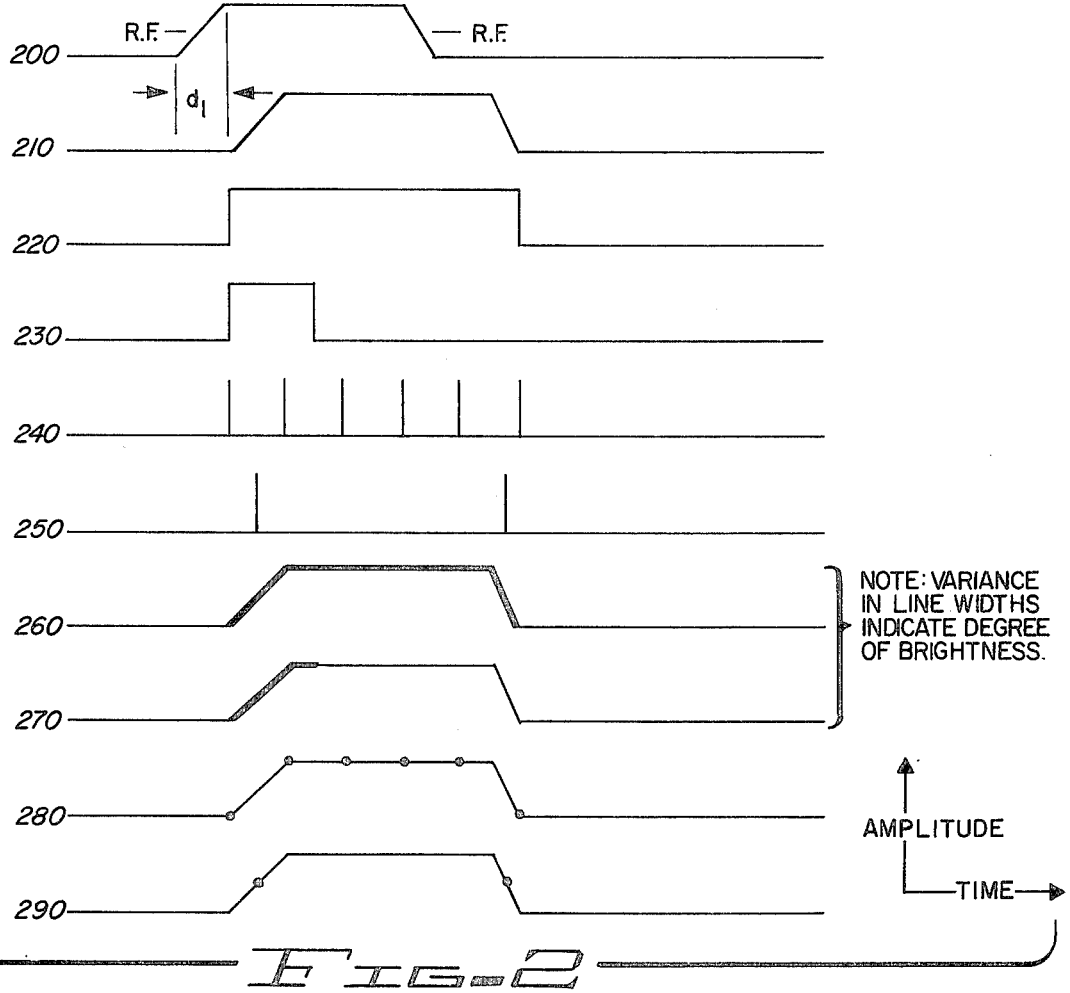

CATHODE RAY DISPLAY INTENSITY MODULATOR

BACKGROUND OF THE INVENTION

This invention relates generally to cathode ray tubes (CRT's) used as part of the commonly known test and diagnostic device, the oscilloscope. As electronics technology has advanced, mainly through the development of semiconductor devices, electronic signal processing has gone to higher and higher frequencies in order that more data may be transmitted in shorter periods of time. This is especially true in the computer industry where computer throughput is limited mainly by the access time to semiconductor memories. Electronic engineers and technicians have had at their disposal this very important piece of equipment that is now almost a necessity in many areas of electronic trouble-shooting. Through the use of the oscilloscope and its portraying of the waveforms under observation an actual fault in electronic equipment may be determined in real time by actual observation rather than requiring the engineer to deduce the error from the symptoms displayed by electronic equipment.

The use of the oscilloscope as a test and diagnostic tool is, however, limited by certain inherent features in the oscilloscopes design. Present day oscilloscopes have an adjustable intensity level that is generally manually operated. Because of this singular intensity during the entire oscilloscope trace time, a bright base line on the CRT display will often prevent a transitory signal from being displayed on the CRT in an intelligible manner. This problem is caused by the necessity of increasing the brightness of the base line in order that the transient might be seen. However, if the transient is of short duration with a relatively fast rise and fall time, its display on the screen may be washed out by the brightness of the base line trace. It is to rectify this situation that stimulated the development of the instant invention.

SUMMARY OF THE INVENTION

The cathode ray display intensity modulator allows the CRT user, not just the oscilloscope user, to adjust the intensity of the slow sweep portion of the display to one brightness level and to adjust the signal portion to a different intensity level. The intensity adjustment of the signal portion of the trace does not have any effect on the intensity of the sweep portion of the trace. In other CRT presentations no attempt was made to control the intensity of parts of that presentation. Generally, all displays had been limited to X and Y type information, i.e., two dimensional. The horizontal dimension of the display was generally called the X axis and, in the case of oscilloscopes in particular, generally calibrated in terms of speed per unit length. The vertical dimension, most often designated the Y axis, is generally calibrated in terms of volts per unit length. A third dimension, the Z axis, is intensity and is normally set to a constant level that is a compromise setting that allows both the base line trace and the signal information to be shown if possible. In the instant invention there is an adjustment for the intensity of the trace allowing selective display intensity at the operator's discretion.

At the same time the above-mentioned advantages are obtained, it is also possible with little additional expense or complexity to display precision control marks for the X and Y axis in real time. Since these axes are generally expressed in terms of speed per unit length and volts per unit length, the following discussion will use this most generally accepted standard. Through the use of commonly available voltage comparators and monostable multivibrators pulses of greater intensity could be displayed on the CRT to indicate reference voltage and timing marks in order that more exacting waveform measurements might be obtained.

The disclosed invention will add another dimension of utility to the already versatile oscilloscope. The oscilloscope, widely used in research laboratories, engineering laboratories, manufacturing facilities, and many types of electronic and mechanical testing and adjusting operations would have their capabilities greatly enhanced so that faster and more accurate measurements could be made. The invention disclosed in this application has a wide variety of possible uses, including investigation into the nature of the electronic arcs, electrical arcs, corona or lightning discharges as the added intensification capability would allow better resolution of the desired signal in hence more usable photographic and visual information. Switching transients could be seen in much better detail with controlled intensification allowing the design engineer to better define and control the transients or effects of the transients. Testing and debugging operations in electronic manufacturing would benefit in that they would be able to observe short duration pulses occurring at long time intervals. In addition, motion and or vibration analysis in machinery and mechanical assemblies could now be converted to electrical impulses and viewed conveniently and accurately with the important parts of the displays selectively intensified.

It is, therefore, an object of this invention to provide an apparatus for extending the capability of CRT displays, and more specifically, the CRT oscilloscope.

It is a further object of this invention to provide means for selectively modulating the intensity of the CRT display at preselected points along the signal waveform.

It is a still further object of this invention to allow real time calibration of the horizontal and vertical axis of a CRT at various desired levels.

It is still another object of this invention to be adaptable to most oscilloscopes now in use.

BRIEF DESCRIPTION OF THE DRAWINGS

FIG. 1 represents a block diagram of the instant invention connected to a cathode ray tube oscilloscope.

FIG. 2 is a timing diagram illustrating the waveforms generated by the instant invention as well as those displayed upon the oscilloscope of FIG. 1.

DETAILED DESCRIPTION OF THE PREFERRED EMBODIMENT

The purpose of the cathode ray display intensity modulator (CRDIM) is to allow operator control of the intensity of the signal portion of the cathode ray tube trace independent of the intensity of the base line sweep trace. As shown in FIG. 1, oscilloscope 101 comprises an intensity input 115, vertical or signal input 110, intensity control 107 and the graticule 105 which covers the display portion of the CRT. Intensity control 107 is used to set the brightness level of the base line trace display and graticule 105 by varying the voltage applied to the electronic accelerator connected to the cathode ray tube. In order to control selectively the brightness of the display it is necessary that the voltage at the accelerator portion of the CRT be capable of being modulated. This result is accomplished by using the waveform desired to be displayed on the oscilloscope as a triggering device for the CRDIM 100. The signal to be observed is connected at signal source 120 and from there to time delay 117 and the high Z input 125 of the CRDIM 100. Time delay 117 may or may not be necessary depending upon the internal delay in the oscilloscope 101 and that of the display module. Proper synchronization between the two is made possible both by time delay 117 and delay 135 of the display module. Input 150 to delay 135 provides the means for varying the delay through the display modulator to synchronize the signal source display on the oscilloscope with the intensity modulation pulses supplied by amplifier 145 to intensity input 115. The use of the cathode ray display intensity modulator in dual beam scopes may be accomplished by connecting one display modulator to the intensity control of each of the intensity control circuits.

It should be noted that the functional units depicted in FIG. 1 as part of display modulator 100 are indicative of the functions performed and does not necessarily require separate circuitry for each of the five functions. It would be obvious to one skilled in the art that it is possible to combine these functions.

The high impedance input 125 of FIG. 1 serves four basic functions. One of these functions is to provide a negligible load to the circuit under test thereby ensuring an accurate representation of the waveform under observation on the oscilloscope. At the same time element 125 can provide adjustment of the input signal and allows the signal source to provide for a positive DC, negative DC or AC signal. Implementation of the high impedance input may be made using a high resistance voltage divider, a field effect transistor in an active mode, an operational amplifier or, for more efficient use, a complementary MOSFET to provide the highest possible input impedance and at the same time be responsive to positive and negative DC signals as well as AC inputs. The resultant output of the high impedance input may consist of either a plurality of pulses indicating the beginning and end of each signal and/or voltage level changes indicating the beginning of the signal and a return to the original voltage level at the end of the signal. In addition, amplification and saturation of the signal, as required by the shaper, may be done at this time. The output of the high impedance input circuit is used as input to the shaper 130. The shaper processes the signal(s) received from the high input impedance input stage to provide a steeply-sloped waveform that is relatively jitter free to enable the shaper output to be used to trigger later circuitry. Another function of the shaper is to provide control so that the treated waveform can be manipulated in such a manner as to allow any portion of the waveform to act as a trigger or clock as determined by the user of the unit. The shaper may be constructed of passive elements to provide signal differentiation followed by an active amplifier stage with bias or threshold control to select that portion of the waveform to be transmitted as the user desires. In general the output of the shaper stage will consist of pulses to indicate the start and end of signal as well as variable pulses controlled in such a way as to occur on any given portion of the input signal selected by the user.

Delay 135 is used to synchronize the intensity modulation signal to the waveform displayed on the CRT. To this end, input 150 to the delay 135 is used to vary the delay between the time an input signal received from the shaper 130 until its output from the delay to switch 140. The delay is made variable by input 150 which may be a variable resistance or capacitance for use with monostable multivibrator R-C control gate if such were used to implement the delay.

Switch 140 receives the delayed signals from delay 135. Inputs 155, 160 and 165 to switch 140 allow variation of the pulse width transmitted to intensity input 115, thereby controlling the amount of time the intensified portion of the signal is displayed on the screen by the CRT. In addition, switch 140 contains the circuitry necessary to implement the calibrated timing and voltage displays on the observed waveform. While it would be possible to superimpose either of these reference pulses upon the intensified portion of the displayed waveform, use of the timing and reference voltage displayed concurrently could result in confusion since there is no way to be able to differentiate the voltage reference signals from the time reference signals. The switch could be constructed of a bistable circuit, such as a J-K flip-flops, D latches, or similar circuitry, including a free running monostable multivibrator for the timing portion of the switch. By way of example, the output signal from delay 135 can be applied to a first input terminal of a bistable latch or flip-flop circuit, while inputs 155, 160 and 165 can be applied to a second input terminal of the bistable circuit. (As will be clear from the following discussion, Input 160 can also be applied to the first input terminal.) Thus an appropriate signal from signal source 120 will cause the bistable circuit to change state, producing a change in intensity on the cathode ray display. A signal from input 155, 160 or 165 will cause the bistable circuit to return to the original state, resulting in a return of the cathode ray display intensity to the original value.

The output of switch 140 is used as input to amplifier 145 which amplifies the pulses or voltage levels received from the switch to provide the proper polarity and output voltage necessary to modulate the intensity control of the CRT in the oscilloscope. Input 170 to amplifier 145 determines the amplitude of the intensity pulse delivered to the intensity input 115. The amplifier may be comprised of a class A amplifier capable of positive and/or negative excursions or a conventional operational amplifier depending upon the CRT's intensity control characteristics.

FIG. 2 illustrates the type of waveforms used by the intensity modulator. The representation of an actual waveform under observation is shown as element 200 of FIG. 2. As shown by waveform 210, which represents the waveform actually displayed on the oscilloscope, a finite time $d_1$ passes between the time the waveform is inputted into the oscilloscope until it is displayed upon the cathode ray tube. This time delay is caused by the internal circuitry of the oscilloscope, and if time delay 117 of FIG. 1 is used, the delay would be increased by that element time constant. Signal 220 represents the output of amplifier 145 when switch 140 has been set to terminate the intensified portion of the waveform on a return to zero basis. Time-base modification is adjustable through input 165 to switch 140 which may also be set up as shown by waveform 230, wherein only the rising edge of waveform 200 is intensified. Representations of these two different intensity inputs from the cathode ray display intensity modulator are shown as waveforms 260 and 270 respectively. As can be seen in 260 the entire waveform is of a greater intensity than that of the baseline whereas in 270 only the leading edge of the waveform is intensified.

FIG. 240 represents the output of amplifier 145 when switch number 140 is responsive to input 155 which controls the calibrated time base. The waveform displayed by the oscilloscope when the intensity circuitry is modulated by waveform 240 is shown by waveform 280. As shown in waveform 280, the displayed signal is intensified on a periodic basis along the signal envelope. The time base may be set at any frequency desired so long as it is not greater than the response time of the intensity circuitry used in the oscilloscope. The pulses shown in signal train 250 represent the outputs of the amplifier when input 160 to switch 140 is utilized. By dialing in any particular reference voltage a comparator of switch 140 may be tripped when the actual waveform reaches that voltage value. In this case, as shown in waveform 200, a particular reference voltage R.F. is selected by input 160 to switch 140. Intensity pulses are then generated when the waveform under observation obtains that voltage and the display shown on the oscilloscope is that shown as waveform 290 in FIG. 2. It should be noted, however, that the ability to display reference voltages on the waveform under observation requires relatively complex circuitry in that the cathode ray display intensity modulator would be considerably less complex if that function were not implemented. Because input 160 should control both states of the bistable circuit in the example cited above, this signal should be applied to both input terminals of the circuit. As will be clear to those skilled in the art, some pulse-shaping circuitry may be required.

While the principles of the invention have now been made clear in an illustrative embodiment, there will be many modifications of the structure, arrangement, proportion, elements, materials, and components that are obvious to those skilled in the art without departing from those principles. The appended claims are therefore intended to cover and embrace any such modifications within the limits of the true scope and spirit of the invention.

What is claimed is:

1. A cathode ray tube display intensity modulator comprising:
   a high impedance input circuit for receiving electronic signals;
   a signal shaper circuit connected to the high impedance circuit for processing the electronic signal;
   a delay circuit for sychronizing an intensity modulation signal with the electronic signal displayed on the cathode ray tube;
   a switching circuit connected to the delay circuit and responsive to a timing base input, a pulse width input, and a reference voltage input; and
   an amplifier circuit responsive to the output of the switch circuit for providing intensity modulation signals to the cathode ray tube.

2. The cathode ray tube display intensity modulator as recited in claim 1, wherein:
   the high impedance input circuit further comprises a metal oxide semiconductor field effect transistor pair; and
   the signal shaper circuit further comprising an active amplifier stage with bias and threshold control.

3. A cathode ray tube display intensity modulator for use with a cathode ray tube oscilloscope comprising:
   high input impedance means connected to a signal source and the vertical input of the oscilloscope;
   signal processing means connected to the output of the high input impedance means for providing an output signal for selective modulation of the intensity of a signal displayed on the oscilloscope, the signal processing means being responsive to a pulse width modulation input, a timing base modulation input and a reference voltage modulation input; and
   amplification means connected to the signal processing means for scaling the output of the cathode ray tube display intensity modulator to the voltages required for intensity modulation of the CRT in the oscilloscope.

* * * * *